US012770827B2

(12) United States Patent
Kim et al.

(10) Patent No.: US 12,770,827 B2
(45) Date of Patent: Oct. 20, 2026

(54) ELECTRODE FOR CAPACITIVELY COUPLED PLASMA GENERATING DEVICE, CAPACITIVELY COUPLED PLASMA GENERATING DEVICE COMPRISING SAME, AND CAPACITIVELY COUPLED PLASMA UNIFORMITY ADJUSTING METHOD

(71) Applicant: KOREA INSTITUTE OF FUSION ENERGY, Daejeon (KR)

(72) Inventors: Jong Sik Kim, Gunsan-si (KR); Yong Hyun Kim, Gunsan-si (KR); Dae Chul Kim, Gunsan-si (KR); Young Woo Kim, Hwaseong-si (KR); Jong Bae Park, Gunsan-si (KR); Jong Hyun Shin, Gunsan-si (KR)

(73) Assignee: KOREA INSTITUTE OF FUSION ENERGY, Daejeon (KR)

( * ) Notice: Subject to any disclaimer, the term of this patent is extended or adjusted under 35 U.S.C. 154(b) by 14 days.

(21) Appl. No.: 19/104,005

(22) PCT Filed: Jul. 3, 2023

(86) PCT No.: PCT/KR2023/009312
§ 371 (c)(1),
(2) Date: Feb. 14, 2025

(87) PCT Pub. No.: WO2024/039061
PCT Pub. Date: Feb. 22, 2024

(65) Prior Publication Data

US 2026/0051457 A1 Feb. 19, 2026

(30) Foreign Application Priority Data

Aug. 18, 2022 (KR) ........................ 10-2022-0103107

(51) Int. Cl.
*H01J 37/32* (2006.01)

(52) U.S. Cl.
CPC .. *H01J 37/32174* (2013.01); *H01J 37/32091* (2013.01); *H01J 37/32541* (2013.01); *H01J 2237/038* (2013.01)

(58) Field of Classification Search
CPC ........... H01J 37/32091; H01J 37/32174; H01J 37/32541; H01J 2237/038
See application file for complete search history.

(56) References Cited

U.S. PATENT DOCUMENTS

2008/0179181 A1* 7/2008 Collins ............. H01J 37/32174 204/164
2017/0213703 A1 7/2017 Sakane
2022/0115206 A1* 4/2022 Hammond ........ H01J 37/32091

FOREIGN PATENT DOCUMENTS

KR 2008-0071491 8/2008
KR 2012-0030719 3/2012
(Continued)

OTHER PUBLICATIONS

International Search Report dated Oct. 4, 2023 for PCT/KR2023/009312.

*Primary Examiner* — Jimmy T Vu
(74) *Attorney, Agent, or Firm* — NORTON ROSE FULBRIGHT US LLP

(57) ABSTRACT

Disclosed are an electrode for a capacitively coupled plasma generating device, a capacitively coupled plasma generating device comprising same, and a capacitively coupled plasma uniformity adjusting method. This electrode for a capacitively coupled plasma generating device may comprise: a first plate-shaped electrode; a second plate-shaped electrode positioned around the first plate-shaped electrode on the same plane as the first plate-shaped electrode; and a power supply unit for applying radio-frequency (RF) power to the first plate-shaped electrode and the second plate-shaped electrode. The power supply unit may apply RF power
(Continued)

having different phases to the first plate-shaped electrode and the second plate-shaped electrode.

11 Claims, 5 Drawing Sheets

(56) References Cited

FOREIGN PATENT DOCUMENTS

| | | |
|---|---|---|
| KR | 2014-0102798 | 8/2014 |
| KR | 2022-0038437 | 3/2022 |

* cited by examiner

ELECTRODE FOR CAPACITIVELY COUPLED PLASMA GENERATING DEVICE, CAPACITIVELY COUPLED PLASMA GENERATING DEVICE COMPRISING SAME, AND CAPACITIVELY COUPLED PLASMA UNIFORMITY ADJUSTING METHOD

CROSS-REFERENCE TO RELATED APPLICATIONS

The present application is a national phase application under 35 U.S.C. § 371 of International Application No. PCT/KR2023/009312 filed Jul. 3, 2023, which claims the benefit of priority to Korean Patent Application No. 10-2022-0103107, filed Aug. 18, 2022. The contents of each of the referenced patent applications are incorporated into the present application by reference.

BACKGROUND

Field of the Disclosure

The present disclosure relates to an electrode for a capacitively-coupled plasma generating apparatus, a capacitively-coupled plasma generating apparatus including the same, and a method for adjusting uniformity of capacitively-coupled plasma.

Description of Related Art

A capacitively-coupled plasma (CCP) generator is one of the most common types of industrial plasma generators, and is an apparatus for generating the plasma by supplying RF power to one of two electrodes facing each other and injecting a reactor gas of a level lower than or equal to atmospheric pressure. The electrode used in such capacitively-coupled plasma generator generally has employed a single electrode. However, as the integration level of an integrated circuit is rapidly increased, research on multiple electrodes is actively being conducted to improve plasma uniformity or maintain intentional non-uniformity. Regarding a disadvantage of the multi-electrodes, for example, when an electrode to which RF power is applied is divided into a first electrode and a second electrode, electrical insulation should be performed between the two electrodes via an insulator. However, in such an insulator region, there is a spatial distribution discontinuity of an electric field generated from the RF power, particularly, RF voltage, and thus there is great difficulty in securing uniformity of a plasma process. Accordingly, there is a need to develop a method for improving the plasma uniformity in a region in which the insulator is installed and a plasma generating apparatus having a function of intentionally adjusting the uniformity.

SUMMARY OF THE INVENTION

A purpose of the present disclosure is to provide a mechanical structure of multiple electrodes for improving plasma non-uniformity occurring in an insulator region required to maintain electrical independence between multiple electrodes, and a method for adjusting plasma uniformity of a capacitively-coupled plasma source through phase adjustment of RF power applied to the multiple electrodes.

In one aspect, the present disclosure provides an electrode for a capacitively-coupled plasma generating apparatus, the electrode comprising: a first plate-shaped electrode; a second plate-shaped electrode positioned around the first plate-shaped electrode and coplanar with the first plate-shaped electrode; and a power supply configured to apply RF (radio-frequency) power to each of the first plate-shaped electrode and the second plate-shaped electrode.

In one embodiment of the electrode for the capacitively-coupled plasma generating apparatus, the power supply is configured to respectively apply RF powers of different phases to the first plate-shaped electrode and the second plate-shaped electrode.

In one embodiment of the electrode for the capacitively-coupled plasma generating apparatus, the power supply is configured to respectively apply RF powers of opposite phases to the first plate-shaped electrode and the second plate-shaped electrode.

In one embodiment of the electrode for the capacitively-coupled plasma generating apparatus, the power supply includes a single power source, and a circuit configured to modify two or more powers generated from the single power source so as to have different phases and to respectively apply the powers of the different phases to the first plate-shaped electrode and the second plate-shaped electrode.

In one embodiment of the electrode for the capacitively-coupled plasma generating apparatus, the power supply further includes a variable element disposed between the circuit and the first plate-shaped electrode and/or between the circuit and the second plate-shaped electrode, wherein the variable element is configured to control each of relative magnitudes of the RF powers to be respectively applied to the first plate-shaped electrode and the second plate-shaped electrode.

In one embodiment of the electrode for the capacitively-coupled plasma generating apparatus, the power supply is configured to control the magnitude of the RF power to be applied to the second plate-shaped electrode to be greater than the magnitude of the RF power to be applied to the first plate-shaped electrode.

In one embodiment of the electrode for the capacitively-coupled plasma generating apparatus, the first plate-shaped electrode is a circular electrode, wherein the second plate-shaped electrode is an annular electrode.

In one embodiment of the electrode for the capacitively-coupled plasma generating apparatus, the electrode for the capacitively-coupled plasma generating apparatus further comprises an annular insulating portion positioned between the first plate-shaped electrode and the second plate-shaped electrode so as to insulate the first plate-shaped electrode and the second plate-shaped electrode from each other.

In another aspect, the present disclosure provides a capacitively-coupled plasma generating apparatus comprising: the electrode for the capacitively-coupled plasma generating apparatus as described above; a substrate formed to face the electrode for the capacitively-coupled plasma generating apparatus; a chamber accommodating the electrode for the capacitively-coupled plasma generating apparatus and the substrate therein; and a gas supply configured to supply a discharge gas to the chamber In still another aspect, the present disclosure provides a method for adjusting uniformity of capacitively-coupled plasma, the method comprising: respectively applying RF powers of different phases to a first plate-shaped electrode and a second plate-shaped electrode, wherein the second plate-shaped electrode is positioned around the first plate-shaped electrode and is coplanar with the first plate-shaped electrode.

In one embodiment of the method for adjusting the uniformity of the capacitively-coupled plasma, respectively applying the RF powers of different phases to the first plate-shaped electrode and the second plate-shaped electrode includes respectively applying the RF powers of opposite phases to the first plate-shaped electrode and the second plate-shaped electrode.

In one embodiment of the method for adjusting the uniformity of the capacitively-coupled plasma, respectively applying the RF powers of different phases to the first plate-shaped electrode and the second plate-shaped electrode includes: modifying two or more powers generated from a single power source so as to have different phases; and respectively applying the powers of the different phases to the first plate-shaped electrode and the second plate-shaped electrode.

In one embodiment of the method for adjusting the uniformity of the capacitively-coupled plasma, the method further comprises controlling a magnitude of each of the RF powers to be respectively applied to the first plate-shaped electrode and the second plate-shaped electrode.

In one embodiment of the method for adjusting the uniformity of the capacitively-coupled plasma, controlling the magnitude of each of the RF powers to be respectively applied to the first plate-shaped electrode and the second plate-shaped electrode includes controlling the magnitude of the RF power to be applied to the second plate-shaped electrode to be greater than the magnitude of the RF power to be applied to the first plate-shaped electrode.

In one embodiment of the method for adjusting the uniformity of the capacitively-coupled plasma, the first plate-shaped electrode is a circular electrode, wherein the second plate-shaped electrode is an annular electrode.

In one embodiment of the method for adjusting the uniformity of the capacitively-coupled plasma, the method further comprises insulating the first plate-shaped electrode and the second plate-shaped electrode from each other.

The multi-electrodes and the multi-power units for the capacitively-coupled plasma generating apparatus according to an embodiment of the present disclosure may generate plasma relatively more uniform than the plasma generated using the multi-electrodes configured using the existing technology even in the vicinity where the insulating portion is located.

According to an embodiment of the present disclosure, the capacitively-coupled plasma generating apparatus including a device such as an impedance matching device of multiple output ports including the variable elements so as to modify or adjust the phase of the RF power, or including the variable element (variable capacitor, variable inductor) capable of controlling the relative magnitude of the RF voltage or current can generate a relatively uniform plasma and can secure a uniform process result.

Though the plasma uniformity adjustment method such as appropriately adjusting the value of the variable element included in the capacitively-coupled electrode according to an embodiment of the present disclosure, the uniformity of plasma on the insulating portion insulating the electrode used for generating the capacitively-coupled plasma may be relatively improved or adjusted.

DETAILED DESCRIPTION OF THE INVENTION

Figure 1A:
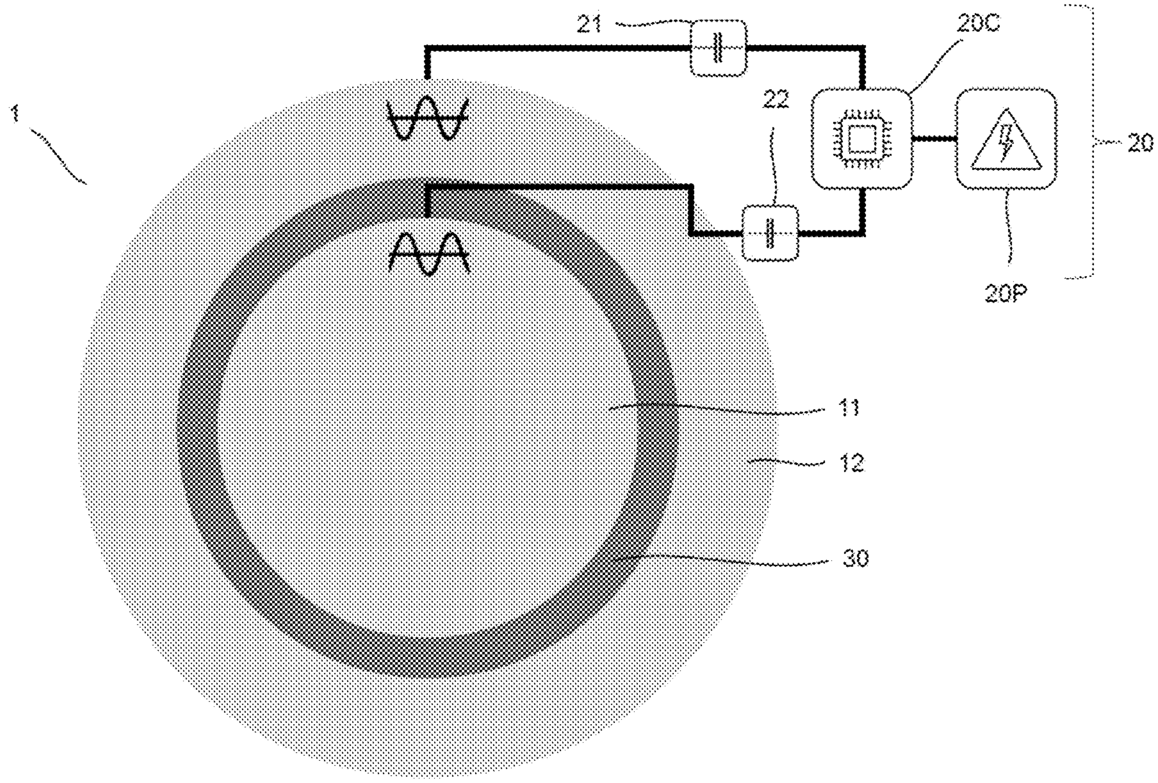
FIGS. 1A and 1B are diagrams showing an electrode for a capacitively-coupled plasma generating apparatus according to an embodiment of the present disclosure.

Hereinafter, embodiments of the present disclosure will be described in detail with reference to the accompanying drawings. The present disclosure may be subjected to various changes and may have various forms. Thus, particular embodiments will be illustrated in the drawings and will be described in detail herein. However, this is not intended to limit the present disclosure to a specific disclosed form. It should be understood that the present disclosure includes all modifications, equivalents, and replacements included in the spirit and technical scope of the present disclosure. While describing the drawings, similar reference numerals are used for similar components. In the accompanying drawings, the dimensions of the structures are shown in an enlarged view for clarity of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A is a diagram illustrating an electrode for a capacitively-coupled plasma generating apparatus according to an embodiment of the present disclosure.

Referring to FIG. 1A, an electrode 1 for a capacitively-coupled plasma generating apparatus according to an embodiment of the present disclosure may include a first plate-shaped electrode 11; a second plate-shaped electrode 12 positioned around the first plate-shaped electrode and coplanar with the first plate-shaped electrode 11; and a power supply 20 for applying RF (radio-frequency) power to the first plate-shaped electrode 11 and the second plate-shaped electrode 12.

Each of the first plate-shaped electrode 11 and the second plate-shaped electrode 12 is a member that performs an electrode function of the capacitively-coupled plasma generation apparatus, and the second plate-shaped electrode 12 is constructed to surround the first plate-shaped electrode 11.

In the context of the present specification, the term "plate-shaped" means a shape having a significantly small thickness compared to a width and substantially no curvature. The plate-shaped electrode is an electrode having a plate shape and is a member capable of providing electrical potential energy or a potential difference to a relatively large area when the power is applied thereto. In FIG. 1A, the first plate-shaped electrode 11 and the second plate-shaped electrode 12 are shown as a circle and an annular shape, respectively. However, the scope of the present disclosure is not necessarily limited thereto. In an embodiment, the first plate-shaped electrode 11 may be a circular electrode, and the second plate-shaped electrode 12 may be an annular electrode.

In one example, the electrode 1 for the capacitively-coupled plasma generating apparatus according to an embodiment of the present disclosure may include an additional electrode other than the first plate-shaped electrode 11 and the second plate-shaped electrode 12. In an embodiment, the electrode 1 for the capacitively-coupled plasma generating apparatus according to an embodiment of the present disclosure may include three or more electrodes. In this case, when one specific first plate-shaped electrode and one specific second plate-shaped electrode among the three or more electrodes are selected, the description of the electrode for the capacitively-coupled plasma generating apparatus according to an embodiment of the present disclosure may be applied. In an embodiment, when the electrode 1 for the capacitively-coupled plasma generating apparatus according to an embodiment of the present disclosure may include three or more electrodes. In this case, when one first plate-shaped electrode and one second plate-shaped electrode are selected in a random manner from the three or more electrodes, the description of the electrode for the capacitively-coupled plasma generating apparatus according to an embodiment of the present disclosure may be applied to each of all of combinations.

The power supply 20 is a member that performs a function of a power source which provides the power to which the first plate-shaped electrode 11 and the second plate-shaped electrode 12 so as to provide electrical potential energy or a potential difference. When the first plate-shaped electrode 11 and the second plate-shaped electrode 12 are used in the capacitively-coupled plasma generation apparatus, the function of the power source may be to apply the power of the radio frequency (RF) thereto. In an embodiment, the power supply 20 may apply RF powers of different phases to the first plate-shaped electrode 11 and the second plate-shaped electrode 12, respectively. In an embodiment, the power supply 20 may apply RF powers of opposite phases to the first plate-shaped electrode 11 and the second plate-shaped electrode 12, respectively.

The solution to the problem of the present disclosure may be based on the discovery that when RF powers of different phases are respectively applied to the first plate-shaped electrode 11 and the second plate-shaped electrode 12 as described above, a change in electrical potential energy generated in an insulating portion may have relatively continuity due to an interference phenomenon between the RF powers respectively applied to the first plate-shaped electrode 11 and the second plate-shaped electrode 12, and in this case, the continuity may be adjusted by adjusting the magnitude of the RF power applied to each of the first plate-shaped electrode 11 and the second plate-shaped electrode 12.

In order to perform the above function, the power supply 20 may be configured to apply RF powers of different phases or opposite phases to the first plate-shaped electrode 11 and the second plate-shaped electrode 12. In an embodiment, the power supply 20 may include two or more power sources which may respectively apply RF powers of different phases or opposite phases to the first plate-shaped electrode 11 and the second plate-shaped electrode 12. In an embodiment, the power supply 20 may include a circuit 20C capable of modifying powers generated from one power source 20P so as to have different phases and respectively applying the two powers of the different phases to the first plate-shaped electrode 11 and the second plate-shaped electrode 12. Accordingly, in an embodiment, the power supply 20 may respectively apply RF powers of different phases to the first plate-shaped electrode 11 and the second plate-shaped electrode 12. In addition, thus, in an embodiment, the power supply 20 may respectively apply RF powers of opposite phases to the first plate-shaped electrode 11 and the second plate-shaped electrode 12. In an embodiment, the circuit 20C may include a device such as an impedance matching device of multiple output ports including variable elements.

Figure 1B:
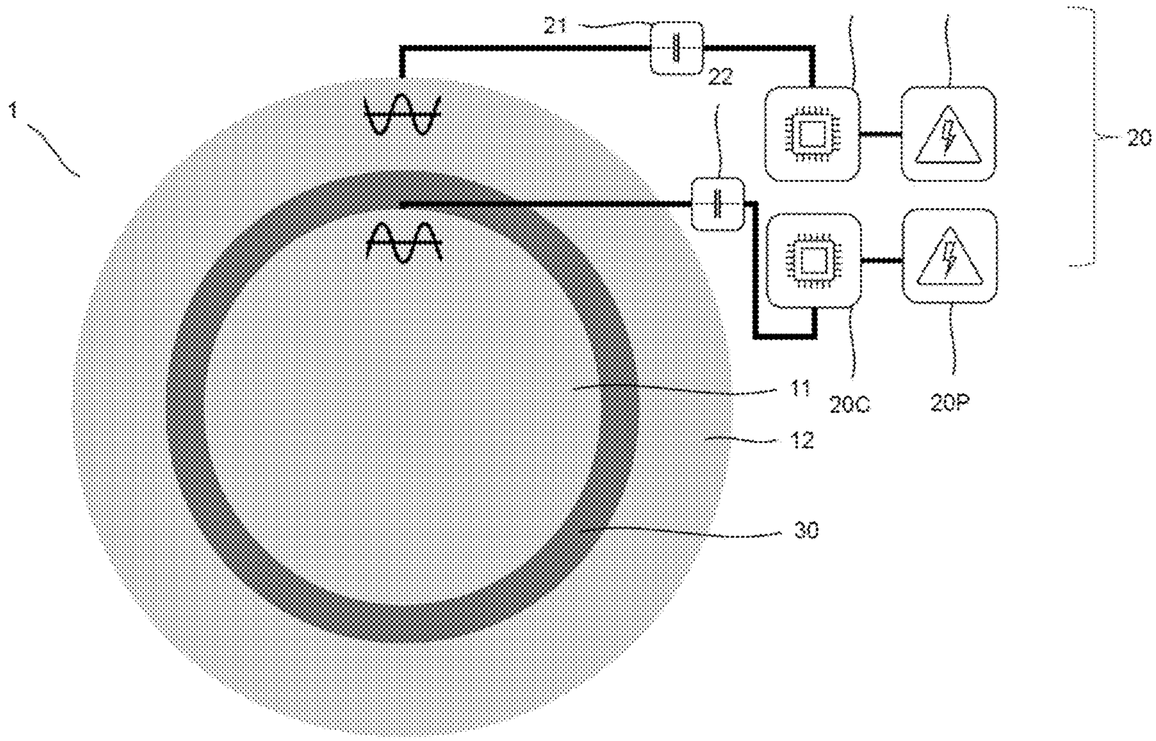

In the case of FIG. 1A, it is illustrated that a single power source 20P is included, and a single circuit 20C for modifying the phases of two or more powers generated therefrom is included. However, this is an example, and the scope of the present disclosure is not limited to the number of power sources 20P and circuits 20C. For example, FIG. 1B is a diagram illustrating another embodiment of an electrode for a capacitively-coupled plasma generating apparatus according to an embodiment of the present disclosure. Referring to FIG. 1B, an electrode 1 for the capacitively-coupled plasma generating apparatus according to an embodiment of the present disclosure may include two or more circuits 20C that respectively modify phases of two or more powers respectively generated from two or more power sources 20P. FIG. 1B illustrates that two power sources 20P and two circuits 20C are present. However, this is one example of various examples in which a plurality of power sources 20P and a plurality of circuits 20C may be included. Thus, each of the number of the power sources 20P and the number of the circuits 20C is not limited to two.

In one example, one solution to the problem of the present disclosure may be based on the discovery as described above that when RF powers of different phases are respectively applied to the first plate-shaped electrode 11 and the second plate-shaped electrode 12 as described above, a change in electrical position energy generated in the insulating portion may have relatively continuity due to an interference phenomenon between the RF powers respectively applied to the first plate-shaped electrode 11 and the second plate-shaped electrode 12, and in this case, the continuity may be adjusted by adjusting the magnitude of the RF power applied to each of the first plate-shaped electrode 11 and the second plate-shaped electrode 12. In order to realize this solution, in an embodiment, the power supply 20 may further include a variable element 21 and 22 capable of controlling the relative magnitudes of the RF powers respectively applied to the first plate-shaped electrode 21 and the second plate-shaped electrode 22, wherein the variable element 21 and 22 may be disposed between the circuit 20C and the first plate-shaped electrode 21 and/or between the circuit 20C and the second plate-shaped electrode 22. In an embodiment, the variable element 21 and 22 may include a variable capacitor. In an embodiment, the variable element 21 and 22 may include a variable inductor. In an embodiment, using the variable element 21 and 22, the power supply 20 may control the magnitude of the RF power to be applied to the second plate-shaped electrode 22 to be greater than the magnitude of the RF power to be applied to the first plate-shaped electrode 21. In an embodiment, using the variable element 21 and 22, the power supply 20 may control the magnitude of the RF power to be applied to the second plate-shaped electrode 22 to be greater than the magnitude of the RF power to be applied to the first plate-shaped electrode 21.

In an embodiment, an annular insulating portion 30 may be further positioned between the first plate-shaped electrode 21 and the second plate-shaped electrode 22 so as to insulate the first plate-shaped electrode 21 and the second plate-shaped electrode 22 from each other.

As described above, the electrode for the capacitively-coupled plasma generating apparatus according to an embodiment of the present disclosure may generate relatively uniform plasma even on the insulating portion.

Figure 2:
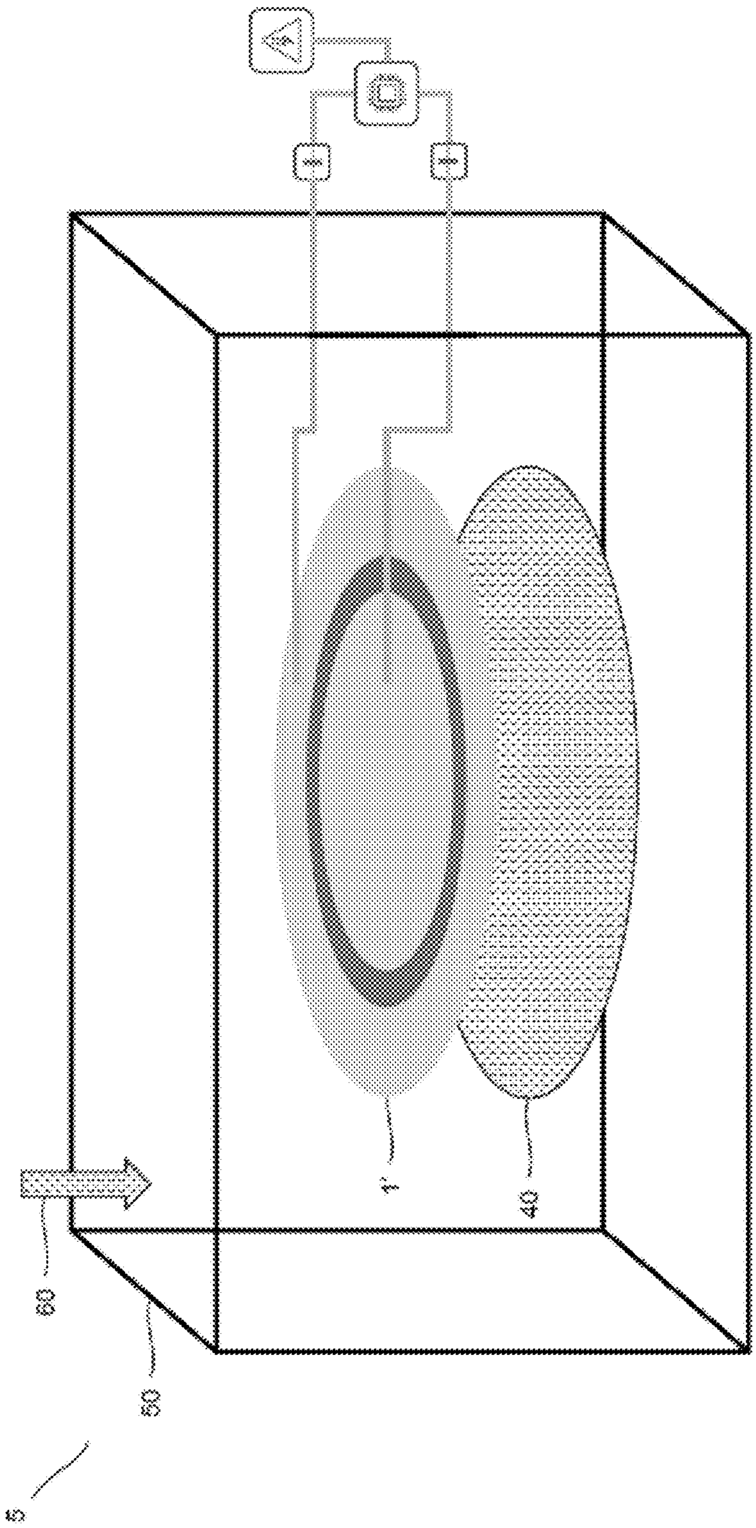
FIG. 2 is a perspective view schematically showing an embodiment of a capacitively-coupled plasma generating apparatus according to an embodiment of the present disclosure.

FIG. 2 is a perspective view schematically showing an embodiment of a capacitively-coupled plasma generating apparatus according to an embodiment of the present disclosure.

Referring to FIG. 2, a capacitively-coupled plasma generation apparatus 5 according to an embodiment of the present disclosure may include an electrode 1' for a capacitively-coupled plasma generation apparatus, a substrate 40 formed to face the electrode 1' for the capacitively-coupled plasma generation apparatus, a chamber 50 accommodating therein the electrode 1' for the capacitively-coupled plasma generation apparatus and the substrate 40 therein, and a gas supply 60 capable of supplying a discharge gas to the chamber 50.

The electrode 1' for the capacitively-coupled plasma generating apparatus may be or include the electrode 1 for the capacitively-coupled plasma generating apparatus according to an embodiment of the present disclosure as described above. Although FIG. 2 illustrates that the first plate-shaped electrode and the second plate-shaped electrode of the electrode 1' for the capacitively-coupled plasma generation apparatus, and the annular insulating portion are arranged horizontally while being received in the chamber 50, and other members are disposed outside the chamber 50, this is merely an example. The orientation and the arrangement of the electrode 1' for the capacitively-coupled plasma generation apparatus are not limited thereto.

The electrode 1' for the capacitively-coupled plasma generating apparatus is a member capable of generating plasma under electrical potential energy or potential difference. Accordingly, when the orientation of the electrode 1' for the capacitively-coupled plasma generating apparatus is determined, the substrate 40 may be formed to face the electrode 1', and thus the orientation of the substrate 40 may be determined. Although FIG. 2 illustrates that the substrate 40 is not electrically connected to other members, this is an example to avoid confusion in the drawings. In an embodiment, the substrate 40 may be grounded.

The chamber 50 is a member capable of accommodating the electrode 1' for the capacitively-coupled plasma generating apparatus and the substrate 40 therein. As known in the art, the capacitively-coupled plasma generation apparatus may generate the plasma in a discharge gas at atmospheric pressure or below or the atmospheric pressure. In this regard, the chamber 50 may perform a function of allowing at least the electrode 1' of the capacitively-coupled plasma generation apparatus and the substrate 40 to be contained in the discharge gas.

The gas supply 60 is a member capable of supplying the discharge gas to the chamber 50.

As described above, the capacitively-coupled plasma generating apparatus according to an embodiment of the present disclosure may apply a relatively uniform plasma to the substrate.

Figure 3:
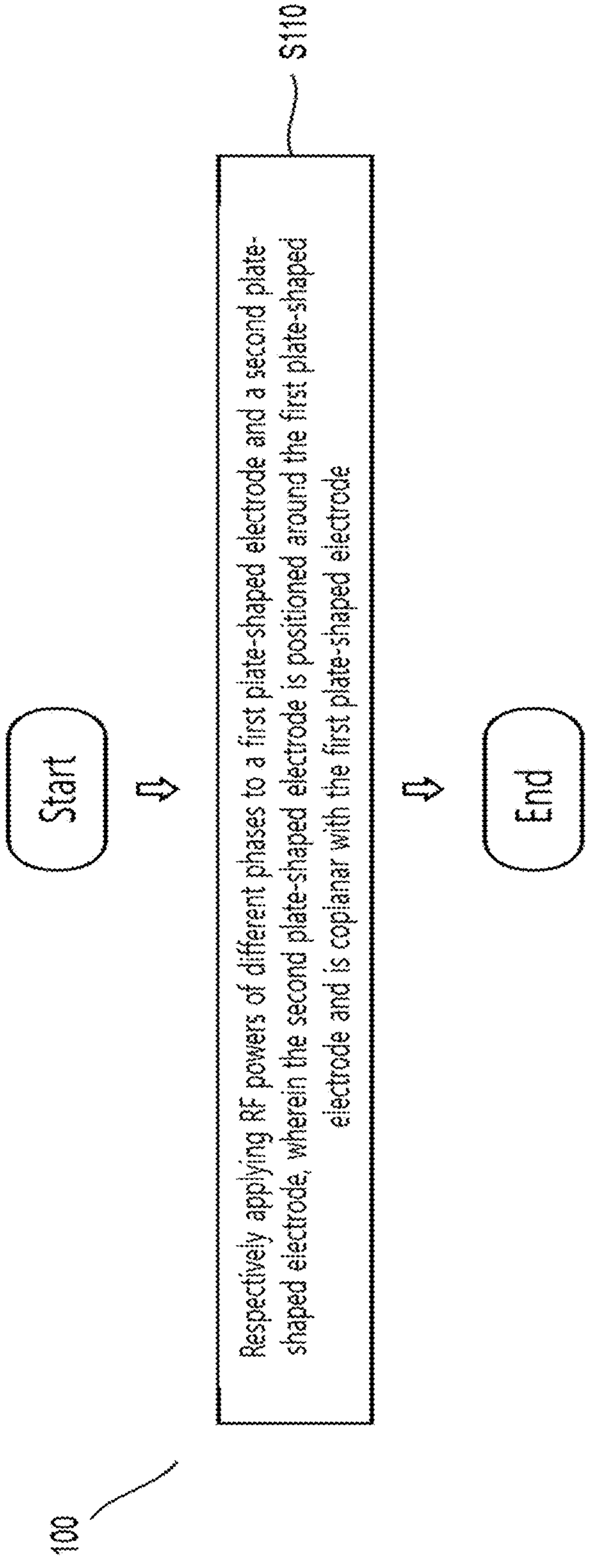
FIG. 3 is a flowchart illustrating a method for adjusting capacitance-coupled plasma uniformity according to an embodiment of the present disclosure.

FIG. 3 is a flowchart illustrating a method for adjusting capacitance-coupled plasma uniformity according to an embodiment of the present disclosure.

Referring to FIG. 3, a capacitively-coupled plasma uniformity adjusting method 100 according to an embodiment of the present disclosure may include respectively applying RF powers of different phases to the first plate-shaped electrode and the second plate-shaped electrode positioned around the first plate-shaped electrode and coplanar with the first plate-shaped electrode in S110.

In the description of the capacitively-coupled plasma uniformity adjustment method 100, the same or similar configuration or component in the capacitively-coupled plasma uniformity adjustment method 100 as or to the same or similar configuration or component of the electrode for the capacitively-coupled plasma generating apparatus according to the above-described embodiment of the present disclosure or the capacitively-coupled plasma generating apparatus according to the above-described embodiment of the present disclosure may be equally subject to the description thereof set forth above.

Therefore, the step S110 of applying the RF powers of the different phases may be a step based on the discovery that, as described above with reference to the electrode for the capacitively-coupled plasma generator according to an embodiment of the present disclosure, when the RF powers of the different phases are respectively applied to the first plate-shaped electrode and the second plate-shaped electrode, a change in electrical potential energy generated in the insulating portion may have relatively continuity due to an interference phenomenon between the RF powers respectively applied to the first plate-shaped electrode and the second plate-shaped electrode, and in this case, the continuity may be adjusted by adjusting the magnitude of the RF power applied to each of the first plate-shaped electrode and the second plate-shaped electrode.

Furthermore, as described above with reference to the electrode for the capacitively-coupled plasma generating apparatus according to an embodiment of the present disclosure, in performing the step S110 of applying the RF powers of the different phases, in an embodiment, RF powers of opposite phases may be respectively applied to the first plate-shaped electrode and the second plate-shaped electrode. In addition, in an embodiment, the applying of the RF powers of the different phases respectively to the first plate-shaped electrode and the second plate-shaped electrode may include modifying the phases of two or more powers generated from one power source to be different from each other and applying the two powers of the different phases respectively to the first plate-shaped electrode and the second plate-shaped electrode.

In addition, in an embodiment, the capacitively-coupled plasma uniformity adjustment method 100 may further include controlling each of the magnitudes of RF powers respectively applied to the first plate-shaped electrode and the second plate-shaped electrode. In an embodiment, the capacitively-coupled plasma uniformity adjustment method may include controlling the magnitude to the RF power applied to the second plate-shaped electrode to be greater than the magnitude of the RF power to be applied to the first plate-shaped electrode.

In an embodiment, the first plate-shaped electrode may be a circular electrode, and the second plate-shaped electrode may be an annular electrode.

In an embodiment, the capacitively-coupled plasma uniformity adjusting method may further include insulating the first plate-shaped electrode and the second plate-shaped electrode from each other.

As described above, the method for adjusting the uniformity of capacitively-coupled plasma according to some embodiments of the present disclosure may allow the uniformity of the plasma on the insulating portion for insulating the electrodes used for generating the capacitively-coupled plasma from each other to be relatively improved or adjusted.

Hereinafter, an embodiment of the present disclosure will be described in detail. However, the embodiments as described below are only some embodiments of the present disclosure, and the scope of the present disclosure is not limited to the following embodiments.

Fabrication of Electrode for Capacitively Coupled Plasma Device

The circular first plate-shaped electrode, the insulating portion surrounding a circumference of the first plate-shaped electrode and insulating the first plate-shaped electrode from the second plate-shaped electrode, and the annular second plate-shaped electrode formed along the circumference of the insulating portion are prepared. The power supply is connected to the first plate-shaped electrode and the second plate-shaped electrode, and the power supply includes a circuit capable of modifying a phase of a RF power from an RF power source and a variable element capable of adjusting the magnitude of the RF power applied to each of the first plate-shaped electrode and the second plate-shaped electrode. The RF power to be applied to the first plate-shaped electrode and the RF power to be applied to the second plate-shaped electrode are adjusted to have the opposite phases (180° phase difference). In particular, the power supply is controlled such that the magnitude of the RF power to be applied to the second plate-shaped electrode is greater than the magnitude of the RF power to be applied to the first plate-shaped electrode.

Manufacture and Operation of Capacitively Coupled Plasma Apparatus

The manufactured electrode for the capacitively-coupled plasma generating apparatus is placed in the chamber, and the substrate is placed in the chamber so as to face the electrode. The substrate is grounded. The discharge gas is injected into the chamber, and the RF power is applied to the electrode so that the plasma is generated in the discharge gas.

Distribution of Electric Field

Figure 4:
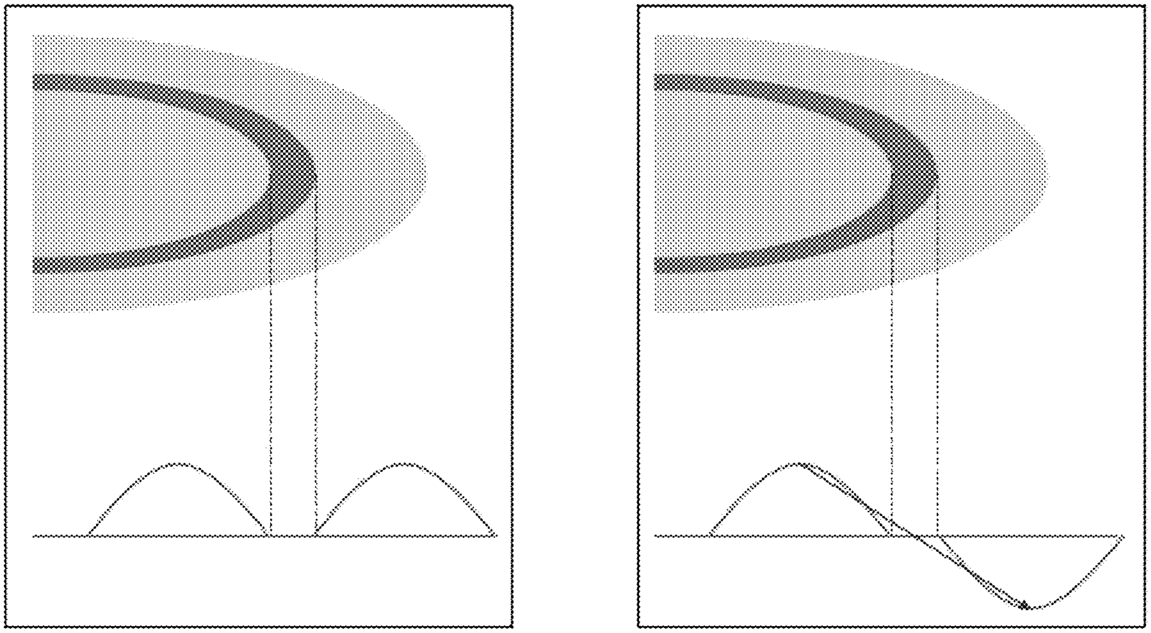
FIG. 4 is a diagram showing a distribution of an electric field of an electrode for a capacitively-coupled plasma generating apparatus according to an embodiment of the present disclosure.

FIG. 4 is a diagram showing the distribution of the electric field when the RF powers of the identical phases (left) are respectively applied to the first plate-shaped electrode and the second plate-shaped electrode of the electrode for the capacitively-coupled plasma generating apparatus according to an embodiment of the present disclosure, and the RF powers of the opposite phases (right) are respectively applied to the first plate-shaped electrode and the second plate-shaped electrode of the electrode for the capacitively-coupled plasma generating apparatus according to an embodiment of the present disclosure. Referring to FIG. 4, it may be identified that when the RF powers of the opposite phases (right) are respectively applied to the first plate-shaped electrode and the second plate-shaped electrode, a distribution of a strong electric field may also occur on an insulating portion between the first plate-shaped electrode and the second plate-shaped electrode Although the present disclosure has been described above with reference to the preferred embodiments of the present disclosure, those skilled in the art will understand that the present disclosure may be variously modified and changed within the scope not departing from the spirit and scope of the present disclosure described in the following patent claims.

REFERENCE NUMERALS

1, 1': Electrode for capacitively-coupled plasma generating apparatus
5: Capacitively-coupled plasma generating apparatus
11: First plate-shaped electrode
12: Second plate-shaped electrode
20: Power supply
20P: Power source
20C: Circuit
21, 22: Variable element
30: Insulating portion
40: Substrate
50: Chamber
60: Gas supply
100: Capacitively-coupled plasma uniformity adjusting method

The invention claimed is:

1. An electrode for a capacitively-coupled plasma generating apparatus, the electrode comprising:
a first plate-shaped electrode;
a second plate-shaped electrode positioned around the first plate-shaped electrode and coplanar with the first plate-shaped electrode;
an annular insulating portion positioned between the first plate-shaped electrode and the second plate-shaped electrode so as to insulate the first plate-shaped electrode and the second plate-shaped electrode from each other; and
a power supply configured to apply RF (radio-frequency) power to each of the first plate-shaped electrode and the second plate-shaped electrode,
wherein the power supply includes a circuit configured to modify two or more powers so as to have different phases and to respectively apply the powers of the different phases to the first plate-shaped electrode and the second plate-shaped electrode, and
wherein the power supply further includes a variable element disposed between the circuit and the first plate-shaped electrode and/or between the circuit and the second plate-shaped electrode, wherein the variable element is configured to control each of relative magnitudes of the RF powers to be respectively applied to the first plate-shaped electrode and the second plate-shaped electrode.

2. The electrode for the capacitively-coupled plasma generating apparatus of claim 1, wherein the power supply is configured to respectively apply RF powers of opposite phases to the first plate-shaped electrode and the second plate-shaped electrode.

3. The electrode for the capacitively-coupled plasma generating apparatus of claim 1, wherein the power supply includes a single power source.

4. The electrode for the capacitively-coupled plasma generating apparatus of claim 1, wherein the power supply is configured to control the magnitude of the RF power to be applied to the second plate-shaped electrode to be greater than the magnitude of the RF power to be applied to the first plate-shaped electrode.

5. The electrode for the capacitively-coupled plasma generating apparatus of claim 1, wherein the first plate-shaped electrode is a circular electrode, wherein the second plate-shaped electrode is an annular electrode.

6. A capacitively-coupled plasma generating apparatus comprising:

the electrode for the capacitively-coupled plasma generating apparatus according to claim 1;

a substrate formed to face the electrode for the capacitively-coupled plasma generating apparatus;

a chamber accommodating the electrode for the capacitively-coupled plasma generating apparatus and the substrate therein; and a gas supply configured to supply a discharge gas to the chamber.

7. A method for adjusting uniformity of capacitively-coupled plasma, the method comprising:

respectively applying RF powers of different phases, via a circuit configured to modify two or more powers so as to have different phases, to a first plate-shaped electrode and a second plate-shaped electrode, wherein the second plate-shaped electrode is positioned around the first plate-shaped electrode and is coplanar with the first plate-shaped electrode, and wherein an annular insulating portion is positioned between the first plate-shaped electrode and the second plate-shaped electrode; and controlling relative magnitudes of the RF powers respectively applied to the first plate-shaped electrode and the second plate-shaped electrode via a variable element disposed between the circuit and the first plate-shaped electrode and/or between the circuit and the second plate-shaped electrode.

8. The method for adjusting the uniformity of the capacitively-coupled plasma of claim 7, wherein respectively applying the RF powers of different phases to the first plate-shaped electrode and the second plate-shaped electrode includes respectively applying the RF powers of opposite phases to the first plate-shaped electrode and the second plate-shaped electrode.

9. The method for adjusting the uniformity of the capacitively-coupled plasma of claim 7, wherein respectively applying the RF powers of different phases to the first plate-shaped electrode and the second plate-shaped electrode includes:

modifying two or more powers generated from a single power source so as to have different phases; and respectively applying the powers of the different phases to the first plate-shaped electrode and the second plate-shaped electrode.

10. The method for adjusting the uniformity of the capacitively-coupled plasma of claim 7, wherein controlling the magnitude of each of the RF powers to be respectively applied to the first plate-shaped electrode and the second plate-shaped electrode includes controlling the magnitude of the RF power to be applied to the second plate-shaped electrode to be greater than the magnitude of the RF power to be applied to the first plate-shaped electrode.

11. The method for adjusting the uniformity of the capacitively-coupled plasma of claim 7, wherein the first plate-shaped electrode is a circular electrode, wherein the second plate-shaped electrode is an annular electrode.

* * * * *